(12) United States Patent
Kim et al.

(10) Patent No.: US 11,126,288 B2
(45) Date of Patent: Sep. 21, 2021

(54) TOUCH SENSOR AND DISPLAY DEVICE HAVING THE SAME

(71) Applicant: SAMSUNG DISPLAY CO, LTD., Yongin-si (KR)

(72) Inventors: Jong Hwa Kim, Yongin-si (KR); Il Joo Kim, Yongin-si (KR); Deok Joong Kim, Yongin-si (KR); Kyung Su Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 99 days.

(21) Appl. No.: 16/249,505

(22) Filed: Jan. 16, 2019

(65) Prior Publication Data
US 2019/0302942 A1    Oct. 3, 2019

(30) Foreign Application Priority Data

Mar. 27, 2018  (KR) ........................ 10-2018-0035312

(51) Int. Cl.
*G06F 3/041*    (2006.01)
*G06F 3/044*    (2006.01)
(Continued)

(52) U.S. Cl.
CPC ............ *G06F 3/0412* (2013.01); *G06F 3/044* (2013.01); *G06F 3/047* (2013.01); *G06F 3/0443* (2019.05);
(Continued)

(58) Field of Classification Search
CPC ........ G06F 3/0412; G06F 3/044; G06F 3/047; H01L 27/3223; H01L 27/323; H01L 27/3276
See application file for complete search history.

(56) References Cited

U.S. PATENT DOCUMENTS 9,818,975 B2    11/2017  Hong et al.
2013/0016065 A1*  1/2013  Reynolds ................ G06F 3/047
345/174

(Continued)

FOREIGN PATENT DOCUMENTS

CN    107342036    11/2017
CN    107656651    2/2018
(Continued)

OTHER PUBLICATIONS

Extended European Search Report dated Jun. 24, 2019 in corresponding European Patent Application No. 19150882.9.

*Primary Examiner* — Shaheda A Abdin
(74) *Attorney, Agent, or Firm* — F. Chau & Associates, LLC

(57) ABSTRACT

A display device includes a display panel including a display area in which an image is displayed and a peripheral area disposed outside of the display area, and a touch sensor disposed on the display panel. The touch sensor includes a plurality of sensor electrodes formed in a repeated arrangement of sensor patterns that forms a touch active area, a plurality of sensor wirings connected to the sensor electrodes and disposed outside of the touch active area, and at least one insulating layer overlapping the display area and the peripheral area. At least a portion of the sensor electrodes is formed over the display area and the peripheral area.

20 Claims, 13 Drawing Sheets

(51) Int. Cl.
   *G06F 3/047*    (2006.01)
   *H01L 27/32*    (2006.01)
(52) U.S. Cl.
   CPC .......... *G06F 3/0446* (2019.05); *G06F 3/0448*
       (2019.05); *G06F 3/04164* (2019.05); *H01L*
       *27/323* (2013.01); *H01L 27/3223* (2013.01);
       *H01L 27/3276* (2013.01); *G06F 2203/04107*
           (2013.01); *G06F 2203/04111* (2013.01)

(56) References Cited

U.S. PATENT DOCUMENTS

| | | | |
|---|---|---|---|
| 2014/0300835 A1 | 10/2014 | Chu et al. | |
| 2015/0021157 A1 | 1/2015 | Tsurusaki et al. | |
| 2015/0185903 A1* | 7/2015 | Park | G06F 3/044 345/173 |
| 2015/0220193 A1 | 8/2015 | Choe et al. | |
| 2015/0370356 A1* | 12/2015 | Hwang | G06F 3/041 345/173 |
| 2016/0170523 A1 | 6/2016 | Park et al. | |
| 2016/0218151 A1* | 7/2016 | Kwon | G06F 3/0412 |
| 2016/0239131 A1 | 8/2016 | Kang | |
| 2016/0306472 A1 | 10/2016 | Park et al. | |
| 2016/0313769 A1* | 10/2016 | Yoshitani | G04G 21/04 |
| 2017/0287992 A1 | 10/2017 | Kwak et al. | |

FOREIGN PATENT DOCUMENTS

| | | |
|---|---|---|
| EP | 2980854 | 3/2016 |
| KR | 10-2016-0072909 | 6/2016 |
| KR | 10-2017-0111827 | 10/2017 |

* cited by examiner

TOUCH SENSOR AND DISPLAY DEVICE HAVING THE SAME

CROSS REFERENCE TO RELATED APPLICATIONS

This application claims priority under 35 U.S.C. § 119 to Korean Patent Application No. 10-2018-0035312, filed on Mar. 27, 2018 in the Korean Intellectual Property Office (KIPO), the disclosure of which is incorporated by reference herein in its entirety.

TECHNICAL FIELD

Exemplary embodiments of the inventive concept relate to display devices. More particularly, exemplary embodiments of the inventive concept relate to touch display devices and touch sensors applied thereto.

DISCUSSION OF THE RELATED ART

A touch sensor is a type of input device commonly used in a display device. For example, in a display device, a touch sensor may be attached to one surface of a display panel or fabricated integrally with the display panel. A user can input information by pressing or touching the touch sensor while viewing an image displayed on a screen of the display device.

With recent advances in display technology, display devices have various shapes other than the traditional rectangular shape. The touch sensitivity at a non-square boundary portion may be lower than the touch sensitivity at the remaining portion (e.g., a center portion of the touch sensor) due to the shape of a standardized sensor electrode and a standardized sensor pattern.

SUMMARY

Exemplary embodiments of the inventive concept provide a touch sensor that increases an area of a sensor electrode corresponding to a non-square boundary.

Exemplary embodiments of the inventive concept provide a display device including the touch sensor.

According to exemplary embodiments, a display device includes a display panel including a display area in which an image is displayed and a peripheral area disposed outside of the display area, and a touch sensor disposed on the display panel. The touch sensor includes a plurality of sensor electrodes formed in a repeated arrangement of sensor patterns that forms a touch active area, a plurality of sensor wirings connected to the sensor electrodes and disposed outside of the touch active area, and at least one insulating layer overlapping the display area and the peripheral area. At least a portion of the sensor electrodes is formed over the display area and the peripheral area.

In exemplary embodiments, each of the display area and the touch active area includes a non-square boundary.

In exemplary embodiments, the sensor electrodes overlap an entirety of the display area and a portion of the peripheral area adjacent to the non-square boundary of the display area.

In exemplary embodiments, each of the sensor electrodes includes a first sensor pattern and a second sensor pattern intersecting with each other. An outermost sensor pattern corresponding to the non-square boundary of the sensor electrodes is formed over the display area and the peripheral area In exemplary embodiments, the touch sensor further includes a conductive pattern disposed in the peripheral area and that overlaps a portion of the outermost sensor pattern. The conductive pattern is connected to the outermost sensor pattern through a contact hole passing through the at least one insulating layer.

In exemplary embodiments, the conductive pattern is disposed between the outermost sensor pattern and the display panel.

In exemplary embodiments, the conductive pattern is disposed on the outermost sensor pattern.

In exemplary embodiments, the conductive pattern includes an opaque conductive material and the sensor electrodes include a transparent conductive material.

In exemplary embodiments, the sensor wirings and the conductive pattern are disposed on a same insulating layer of the at least one insulating layer.

In exemplary embodiments, the sensor wirings and the sensor electrodes are disposed on a same insulating layer of the at least one insulating layer.

In exemplary embodiments, the peripheral area includes a margin area in contact with a boundary of the display area. The outermost sensor pattern includes a first conductive layer pattern corresponding to the display area and the margin area, and a second conductive layer pattern connected to the first conductive layer pattern through a contact hole passing through the at least one insulating layer. The second conductive layer pattern corresponds to the peripheral area disposed outside of the margin area.

In exemplary embodiments, the first conductive layer pattern includes a transparent conductive material, and the second conductive layer pattern includes an opaque conductive material.

In exemplary embodiments, the touch sensor further includes a plurality of dummy electrodes disposed between the sensor patterns.

In exemplary embodiments, an outermost dummy electrode corresponding to the non-square boundary of the dummy electrodes is formed over the display area and the peripheral area.

In exemplary embodiments, the touch sensor further includes at least one shield electrode disposed between the sensor electrodes and the sensor wirings in the peripheral area. The at least one shield electrode shields an electrical influence between the sensor electrodes and the sensor wirings.

According to exemplary embodiments of the inventive concept, a display device includes a display panel including a display area including a non-square boundary and a peripheral area disposed outside of the display area, and a touch sensor disposed on the display panel. The touch sensor includes a plurality of sensor electrodes formed in a repeated arrangement of sensor patterns that form a touch active area, a plurality of dummy electrodes disposed between the sensor patterns, and a plurality of sensor wirings connected to the sensor electrodes and disposed outside of the touch active area. An outermost sensor pattern corresponding to the non-square boundary of the sensor electrodes and an outermost dummy electrode corresponding to the outermost sensor pattern of the dummy electrodes are formed over a portion of the display area and a portion of the peripheral area.

In exemplary embodiments, the display device further includes an anti-reflection layer disposed on the touch sensor.

In exemplary embodiments, the peripheral area includes a margin area in contact with a boundary of the display area.

The outermost sensor pattern and the outermost dummy electrode include a first conductive layer pattern corresponding to the display area and the margin area, and a second conductive layer pattern disposed on a layer different from the first conductive layer pattern and separated from the first conductive layer pattern by an insulating layer. The second conductive layer pattern corresponds to the peripheral area disposed outside of the margin area.

In exemplary embodiments, the second conductive layer pattern forming the outermost sensor pattern is connected to the first conductive layer pattern through a contact hole passing through the insulating layer.

In exemplary embodiments, the first conductive layer pattern includes a transparent conductive material, and the second conductive layer pattern includes an opaque conductive material.

In exemplary embodiments, the touch sensor further includes an anti-reflection conductive pattern disposed on the peripheral area such that it overlaps a portion of the outermost sensor pattern overlapping the peripheral area and a portion of the outermost dummy electrode overlapping the peripheral area.

According to exemplary embodiments, a touch sensor includes a plurality of sensor electrodes formed in a repeated arrangement of sensor patterns that form a touch active area having a non-square boundary, a plurality of sensor wirings connected to the sensor electrodes and disposed outside of the touch active area, and at least one insulating layer overlapping the touch active area and a peripheral area disposed outside of the touch active area. An outermost sensor pattern corresponding to the non-square boundary of the sensor electrodes includes a transparent conductive layer and an opaque conductive layer connected to the transparent layer through a contact hole passing through the at least one insulating layer.

In exemplary embodiments, the contact hole is formed at an outermost portion of the transparent conductive layer. The opaque conductive layer extends in a direction that does not overlap the transparent conductive layer from the outermost portion of the transparent conductive layer.

In exemplary embodiments, the transparent conductive layer of the outermost sensor pattern is disposed over a display area in which an image is displayed and the peripheral area adjacent to the display area, and the opaque conductive layer is disposed in the peripheral area. The opaque conductive layer overlaps the transparent conductive layer in the peripheral area.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF EXEMPLARY EMBODIMENTS

Figure 1:
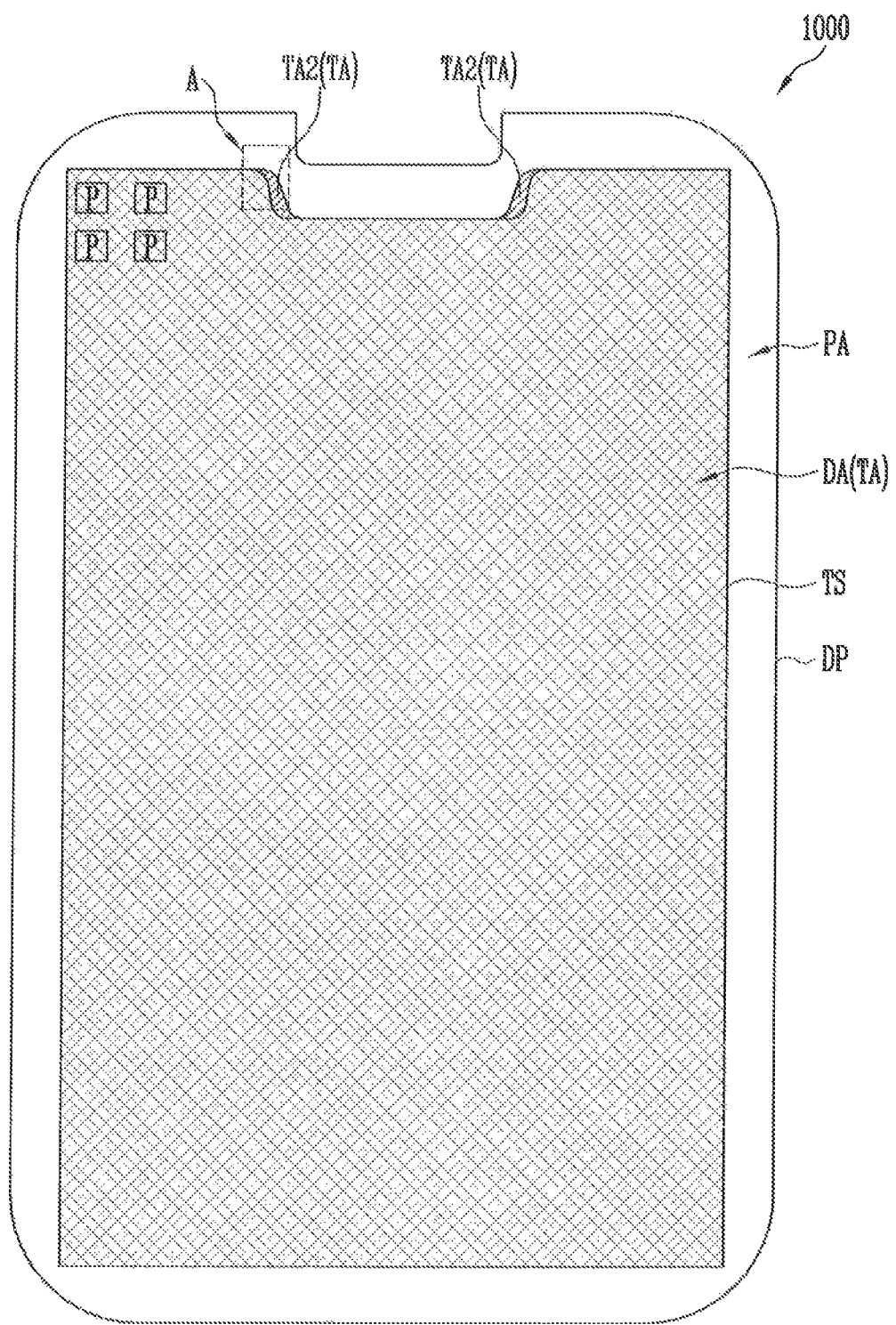
FIG. 1 is a block diagram of a display device according to exemplary embodiments of the inventive concept.

Exemplary embodiments of the inventive concept will be described more fully hereinafter with reference to the accompanying drawings. Like reference numerals may refer to like elements throughout the accompanying drawings.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. In addition, it will also be understood that when a layer is referred to as being "between" two layers, it can be the only layer between the two layers, or one or more intervening layers may also be present.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

FIG. 1 is a block diagram of a display device according to exemplary embodiments of the inventive concept.

Referring to FIG. 1, in exemplary embodiments, the display device 1000 includes a display panel DP and a touch sensor TS. In addition, the display device 1000 may further include a touch driver for driving the touch sensor TS and a display driver for driving the display panel DP.

The touch sensor TS and the display panel DP may be attached to each other after being separately manufactured, or may be integrally manufactured. For example, the touch sensor TS may be disposed directly on the display panel DP. In exemplary embodiments, the touch sensor TS may be bonded to the display panel DP via an adhesive layer/adhesive member. In exemplary embodiments, the touch sensor TS may be formed inside the display panel DP.

In exemplary embodiments, the display panel DP includes a display area DA and a peripheral area PA surrounding at least one boundary of the display area DA. The display area DA may be provided with a plurality of scan lines, a plurality of data lines, and a plurality of pixels P connected to the scan lines and the data lines. Wiring for supplying various driving signals and/or driving power voltage for driving the pixels P may be provided in the peripheral area PA. In exemplary embodiments, a scan driver for driving the pixels P may be disposed in the peripheral area PA, and pads to which a driver integrated circuit (IC) including the data driver is connected may be disposed in the peripheral area PA. The peripheral area PA may correspond to a bezel area of the display device 1000.

In exemplary embodiments, the display area DA includes non-square boundaries. For example, at least one corner of the display area DA may be a curved corner. Also, the display area DA itself may be circular or elliptical. Alternatively, the display area DA may be a polygonal shape such as, for example, a pentagon, a hexagon, or an octagon. That is, the corner having a non-square boundary of the display area DA may be formed as an obtuse angle or an acute angle shape. In exemplary embodiments, the display area DA has a trench (or notch) portion. Herein, the terms "trench portion" and "notch portion" may be used interchangeably.

The type of the display panel DP is not particularly limited. For example, the display panel DP may be a self-luminous display panel such as an organic light emitting diode (OLED) display panel. Alternatively, the display panel DP may be a non-luminous display panel such as a liquid crystal display (LCD) panel, an electro-phoretic display (EPD) panel, an electro-wetting display (EWD) panel, or a quantum dot display panel.

In exemplary embodiments, the touch sensor TS includes a touch active area TA and TA2 in which a touch input is sensed, and an inactive area surrounding at least a portion of the touch active area TA and TA2. In exemplary embodiments, the touch active area TA and TA2 are arranged to correspond to the display area DA of the display panel DP, and the inactive area is arranged to correspond to the peripheral area PA of the display panel DP. The touch active area TA and TA2 may include a non-square boundary (e.g., corresponding to TA2 of FIG. 1), and the touch active area TA2 corresponding to the non-square boundary may be out of the corresponding display area DA. Accordingly, an area of the touch active area TA and TA2 at the non-square boundary may be larger than an area of the display area DA.

For example, as shown in FIG. 1, in exemplary embodiments, the touch active area TA and TA2 overlap the entire display area DA and a portion of the peripheral area PA adjacent to the non-square boundary of the display area DA.

In exemplary embodiments, the area of the touch active area TA and TA2 may be larger than the display area DA. For example, in terms of securing an alignment margin of the touch sensor TS and the display panel DP, the touch active area TA and T2 may be designed to be larger than the display area DA. For example, for the alignment margin, a width between the boundary of the touch active area TA excluding the touch active area TA2 corresponding to the non-square boundary and the boundary of the display area DA may be set to about 10 um or less.

For example, in exemplary embodiments, the width between the boundary of the touch active area TA of a square portion for the alignment margin and the boundary of the display area DA may be about 5 um. That is, in the square portion, sensor electrodes (and an outermost sensor pattern included therein) of the touch sensor TS may be formed to extend from the corresponding boundary of the display area DA to the peripheral area PA by about 5 um.

The width between the boundary of the touch active area TA2 corresponding to the non-square boundary and the boundary of the display area DA corresponding thereto may be set larger than the width in the other part. For example, the width between the boundary of the touch active area TA2 and the boundary of the display area DA at the non-square boundary portion may be set to about 20 um to about 30 um. That is, an outermost sensor pattern of the sensor electrode corresponding to the non-square boundary may be formed to extend to the peripheral area PA out of the display area DA by about 20 um to about 30 um.

As described above, in exemplary embodiments, the area of the outermost sensor pattern of the sensor electrode corresponding to the non-square boundary of the display area DA may be maximally extended to the peripheral area PA. As a result, touch sensitivity at the non-square boundary portion of the display area DA can be improved.

In exemplary embodiments, the touch sensor TS may be a self-capacitive touch sensor and/or a mutual-capacitive touch sensor.

Figure 2:
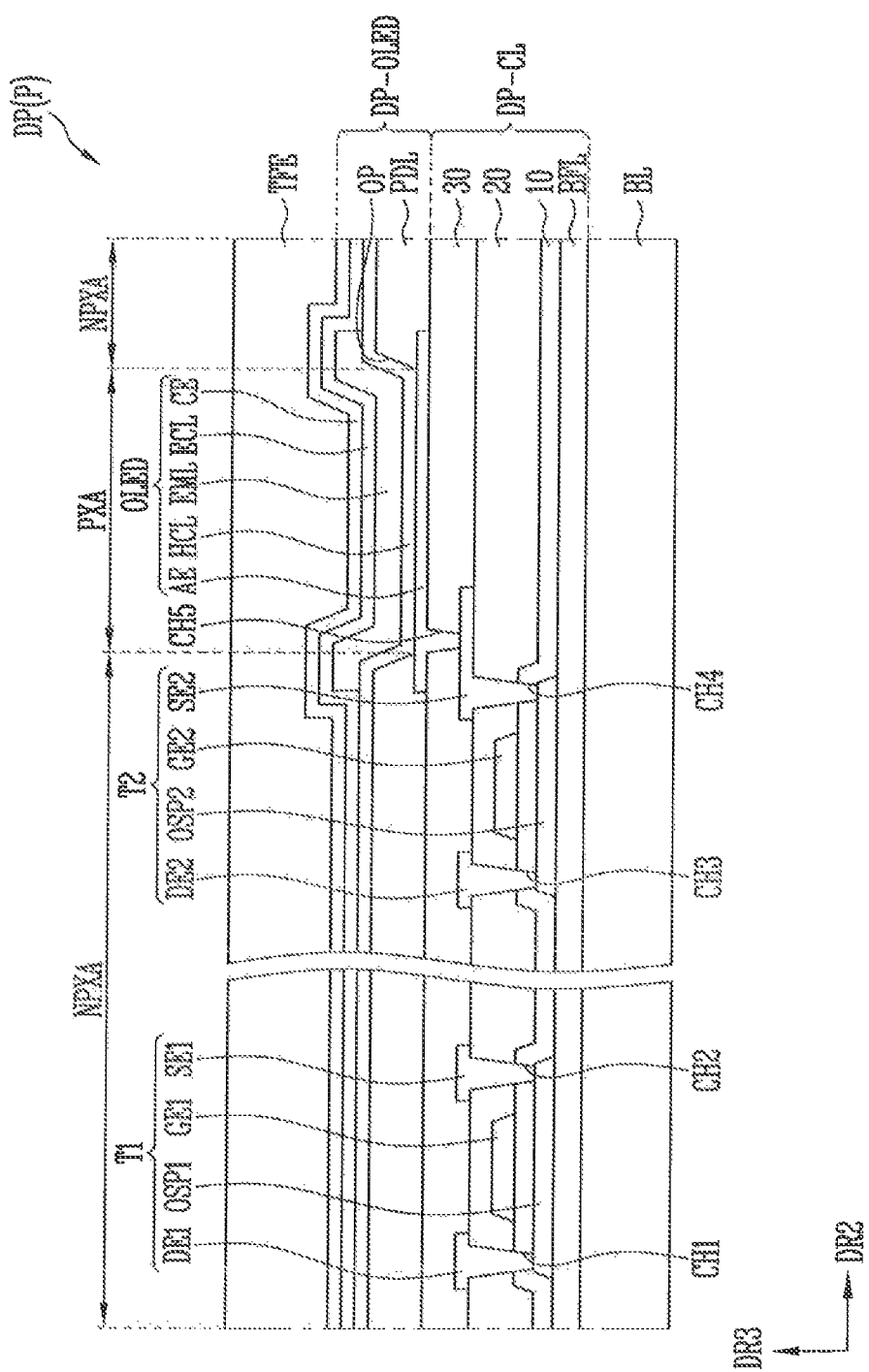
FIG. 2 is a cross-sectional view illustrating an example of a display panel included in the display device of FIG. 1.

FIG. 2 is a cross-sectional view illustrating an example of a display panel included in the display device of FIG. 1.

Referring to FIGS. 1 and 2, in exemplary embodiments, the display panel DP includes the display area DA having a plurality of pixels P. FIG. 2 shows a portion of the display area DA.

As shown in FIG. 2, in exemplary embodiments, a circuit element layer DP-CL, a display element layer DP-OLED, and a thin film encapsulation layer TFE are sequentially disposed on a base layer BL in a third direction DR3. The circuit element layer DP-CL may include a buffer layer BFL, a first insulating layer 10, a second insulating layer 20, and a planarization layer 30. The buffer layer BFL, the first insulating layer 10, and the second insulating layer 20 may include, for example, an inorganic material, and the planarization layer 30 may include, for example, an organic material. Materials of the organic material and the inorganic material are not particularly limited. In exemplary embodiments, the buffer layer BFL may be selectively arranged or omitted.

In exemplary embodiments, the base layer BL may include a synthetic resin film. In exemplary embodiments, the base layer BL may include an organic substrate, a metal substrate, an organic/inorganic composite substrate, etc.

A first transistor T1 and a second transistor T2 are circuit elements for emitting light of a display element. A semiconductor pattern OSP1 of the first transistor T1 and a semiconductor pattern OSP2 of the second transistor T2 may be disposed on the buffer layer BFL. The first semiconductor pattern OSP1 and the second semiconductor pattern OSP2 may be selected from, for example, amorphous silicon, polysilicon, and metal oxide semiconductors.

The first insulating layer 10 may be disposed on the first semiconductor pattern OSP1 and the second semiconductor pattern OSP2. A control electrode GE1 (hereinafter, a first control electrode) of the first transistor T1 and a control electrode GE2 (hereinafter, a second control electrode) of the second transistor T2 may be disposed on the first insulating layer 10.

The second insulating layer 20 covering the first control electrode GE1 and the second control electrode GE2 may be disposed on the first insulating layer 10. An input electrode DE1 (hereinafter, a first input electrode) of the first transistor T1, an output electrode SE1 (hereinafter, a first output electrode) of the first transistor T1, an input electrode DE2 (hereinafter, a second input electrode) of the second transistor T2, and an output electrode SE2 (hereinafter, a second output electrode) of the second transistor T2 may be formed on the second insulating layer 20.

The first input electrode DE1 and the first output electrode SE1 may be electrically connected to the first semiconductor pattern OSP1 through a first contact hole CH1 and a second contact hole CH2 passing through the first insulating layer 10, respectively. The second input electrode DE2 and the second output electrode SE2 may be electrically connected to the second semiconductor pattern OSP2 through a third contact hole CH3 and a fourth contact hole CH4 passing through the first insulating layer 10 and the second insulating layer 20, respectively. In exemplary embodiments, at least one of the first transistor T1 and the second transistor T2 may be implemented as a bottom gate structure.

The display element layer DP-OLED may be disposed on the planarization layer 30. The display element layer DP-OLED may include a pixel defining layer PDL and an organic light emitting diode OLED. The pixel defining layer PDL may include an organic material. A first electrode AE may be disposed on the planarization layer 30. The first electrode AE may be connected to the second output electrode SE2 of the second transistor T2 through a fifth contact hole CH5 passing through the planarization layer 30. An opening OP may be defined in the pixel defining layer PDL. The opening OP of the pixel defining layer PDL may expose at least a part of the first electrode AE. In exemplary embodiments, the pixel defining layer PDL may be omitted.

The pixel P is disposed in the display area DA. The display area DA may include an emission area PXA and a non-emission area NPXA adjacent to the emission area PXA. The non-emission area NPXA may surround the emission area PXA. For example, as shown in FIG. 2, in exemplary embodiments, the non-emission area NPXA is disposed on both sides of the emission area PXA.

A hole control layer HCL may be disposed in common to the emission area PXA and the non-emission area NPXA. A common layer such as the hole control layer HCL may be formed in common to the pixels P.

A light emitting layer EML may be disposed on the hole control layer HCL. The light emitting layer EML may be disposed in an area corresponding to the opening OP. That is, the light emitting layer EML may be separately formed in each of the pixels PX.

Although the patterned light emitting layer EML is exemplarily illustrated in an exemplary embodiment according to FIG. 2, the light emitting layer EML may be disposed in common to the pixels PX. In this case, the light emitting layer EML may generate white light. Further, the light emitting layer EML may have a multi-layer structure called a tandem.

An electron control layer ECL may be disposed on the light emitting layer EML. The electron control layer ECL may be formed in common to the pixels P. A second electrode CE may be disposed on the electron control layer ECL. The second electrode CE may be disposed in common to the pixels PX. The second electrode CE may also be referred to herein as a common electrode.

The thin film encapsulation layer TFE may be disposed on the second electrode CE. The thin film encapsulation layer TFE may be disposed in common to the pixels PX. In exemplary embodiments, the thin film encapsulation layer TFE may directly cover the second electrode CE. In exemplary embodiments, the thin film encapsulation layer TFE may have a form in which an organic layer and an inorganic layer are deposited in a plurality of alternating patterns. In this case, the display panel DP may be formed of a flexible display panel, a curved display panel, etc. In exemplary embodiments, an encapsulating substrate in the form of a glass substrate may be used in place of the thin film encapsulating layer TFE. In this case, the display panel DP may be a rigid display panel.

Figure 3A:
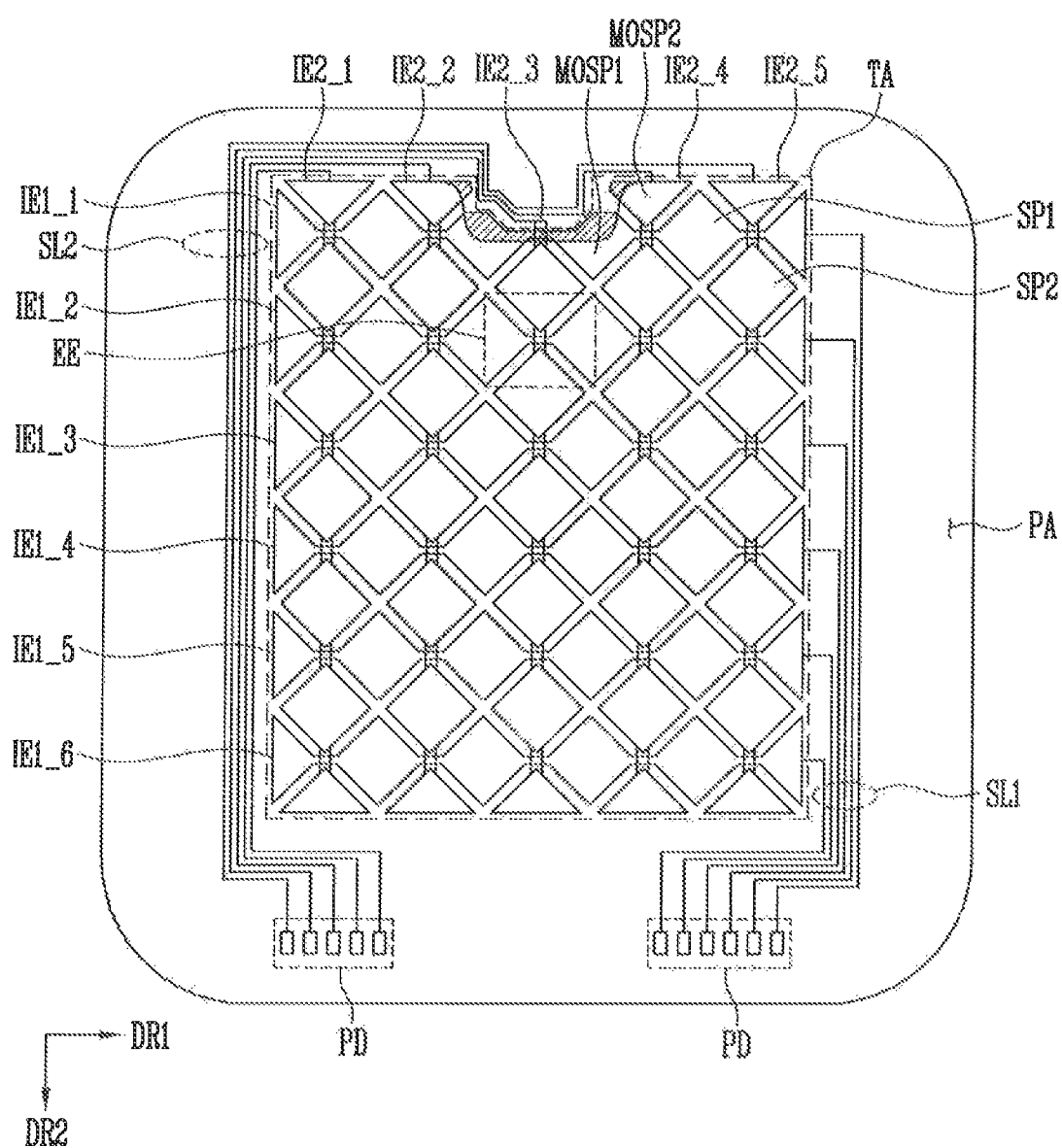
FIGS. 3A and 3B are diagrams illustrating examples of a touch sensor included in the display device of FIG. 1.
Figure 3B:
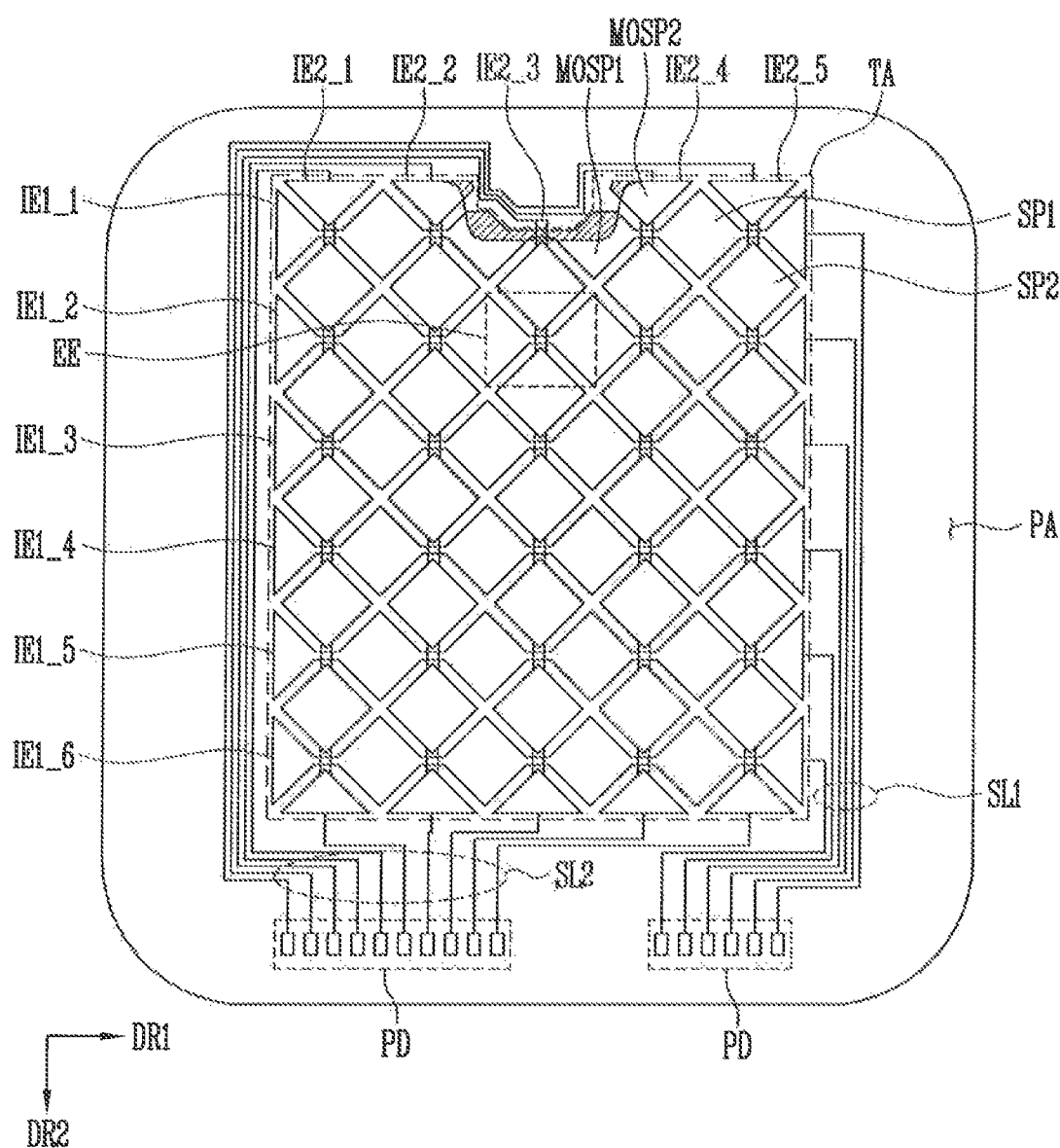

FIGS. 3A and 3B are diagrams illustrating examples of a touch sensor included in the display device of FIG. 1.

Referring to FIGS. 1, 3A, and 3B, in exemplary embodiments, the touch sensor TS includes a plurality of sensor electrodes IE1_1 to IE1_6 and IE2_1 to IE2_5 and a plurality of sensor wirings SL1 and SL2 connected to the respective sensor electrodes IE1_1 to IE1_6 and IE2_1 to IE2_5.

The touch sensor TS may further include a dummy electrode disposed between the sensor electrodes IE1_1 to IE1_6 and IE2_1 to IE2_5, and shield electrodes disposed between the sensor wirings SL1 and SL2. In addition, the touch sensor TS may further include an anti-static wiring surrounding the touch active area TA for preventing electrostatic in the peripheral area PA.

The touch active area TA of the touch sensor TS may correspond to the display area DA of the display panel DP, and the touch inactive area may correspond to the peripheral area PA of the display panel DP. At the non-square boundary portion, the touch active area TA may be larger than the display area DA corresponding thereto. For example, a portion of the sensor electrodes IE1_1 to IE1_6 and IE2_1 to IE2_5 may be disposed outside the display area DA corresponding to the non-square boundary portion.

The sensor electrodes IE1_1 to IE1_6 and IE2_1 to IE2_5 may be formed of a repeated arrangement of sensor patterns. The sensor electrodes IE1_1 to IE1_6 and IE2_1 to IE2_5 may include first sensor electrodes IE1_1 to IE1_6 and second sensor electrodes IE2_1 to IE2_5 intersecting each other. The sensor electrodes IE1_1 to IE1_6 and IE2_1 to IE2_5 may detect an external input by, for example, a mutual cap method and/or a self-cap method.

The first sensor electrodes IE1_1 to IE1_6 may be arranged in a second direction DR2, and may each have a shape extending in a first direction DR1. Each of the first sensor electrodes IE1_1 to IE1_6 may include a first sensor pattern SP1 and first connection portions for connecting portions of the first sensor pattern SP1 to each other. Each of the second sensor electrodes IE2_1 to IE2_5 may include a second sensor pattern SP2, and second connection portions for connecting portions of the second sensor pattern SP2 to each other. The two first sensor patterns disposed at both ends of each of the first sensor electrodes IE1_1 to IE1_6 may have a smaller size than the first sensor pattern disposed at the center of the touch active area TA. For example, the two first sensor patterns disposed at both ends of each of the first sensor electrodes IE1_1 to IE1_6 may be about half the size of the first sensor pattern disposed at the center of the touch active area TA. The two second sensor patterns disposed at both ends of each of the second sensor electrodes IE2_1 through IE2_5 may have a smaller size than the second sensor pattern disposed at the center of the touch active area TA. For example, the two second sensor patterns disposed at both ends of each of the second sensor electrodes IE2_1 to IE2_5 may be about half the size of the second sensor pattern disposed at the center of the touch active area TA. In exemplary embodiments, areas of the sensor patterns at both ends of the first sensor electrodes IE1_1 to IE1_6 and the second sensor electrodes IE2_1 to IE2_5 may be substantially equal to the area of the sensor patterns at the center of the touch active area TA.

As illustrated in FIGS. 1 and 3A, in exemplary embodiments, outermost sensor patterns MOSP1 and MOSP2 disposed in the non-square display area are formed over the display area DA and the peripheral area PA. Here, a shape of the outermost sensor patterns MOSP1 and MOSP2 may be arbitrarily formed depending on an arrangement of peripheral wirings.

In a conventional touch sensor, the outermost sensor pattern overlapping the non-square area (e.g., a trench portion) has a shape cut along the trench shape of the display area DA. As a result, the area of the outermost sensor pattern decreases, and the touch capacitance and the sensing sensitivity may decrease.

However, the touch sensor TS according to exemplary embodiments may sufficiently expand the outermost sensor patterns MOSP1 and MOSP2 overlapping the non-square boundary of the display area DA (e.g., the trench or round boundary) to the peripheral area PA. As a result, touch capacitance may be improved and sufficient touch capacitance may be ensured. Therefore, the touch sensitivity and the sensing accuracy in the non-square boundary portion (e.g., the trench area, round area, etc.) of the display area DA may be improved.

In FIG. 3A, the first sensor pattern SP1 and the second sensor pattern SP2 are shown as including portions having a rhombic shape. However, the shapes of the first sensor pattern SP1 and the second sensor pattern SP2 are not limited thereto. For example, the first and second sensor patterns SP1 and SP2 may have various polygonal shapes.

In exemplary embodiments, a connecting portion connecting the first outermost sensor patterns MOSP1 included in one first sensor electrode IE1_1 may be formed in the peripheral area PA. For example, since all of the sensor patterns included in the first sensor electrode IE1_1 are connected to each other, the connecting portion connecting the first outermost sensor patterns MOSP1 may be formed in the peripheral area PA adjacent to the non-square boundary.

In exemplary embodiments, second sensor wirings SL2 may extend along the non-square boundary as illustrated in FIG. 3A. That is, the second sensor wirings SL2 may have a layout corresponding to the boundary of the touch active area TA. Thus, a width of the peripheral area PA at the non-square boundary may be reduced, and the width of the bezel may be reduced.

The sensor wirings SL1 and SL2 may be connected to the sensor electrodes IE1_1 to IE1_6 and IE2_1 to IE2_5, respectively. The sensor wirings SL1 and SL2 may be disposed in the outer periphery of the touch active area TA (e.g., the peripheral area PA). The sensor wirings SL1 and SL2 include the first sensor wirings SL1 and the second sensor wirings SL2.

The first sensor wirings SL1 may be connected to one end of the first sensor electrodes IE1_1 to IE1_6, respectively. The second sensor wirings SL2 may be connected to one end of the second sensor electrodes IE2_1 to IE2_5, respectively.

However, as shown in FIG. 3B, in exemplary embodiments, the second sensor wirings SL2 may be connected to both ends of the second sensor electrodes IE2_1 to IE2_5, respectively. In this case, the touch sensitivity at the second sensor electrodes IE2_1 to IE2_5 may be further improved. Since, in exemplary embodiments, the second sensor electrodes IE2_1 to IE2_5 are longer than the first sensor electrodes IE1_1 to IE1_6, a voltage drop of a detection signal (or a transmission signal) is large at the second sensor electrodes IE2_1 to IE2_5, and the touch sensitivity may be decreased. According to the exemplary embodiment of FIG. 3B, since the detection signal (or transmission signal) is provided through the second sensor wirings SL2 connected to both ends of the second sensor electrodes IE2_1 to IE2_5,
the detection signal (or transmission signal) may be prevented from being lowered, thereby preventing deterioration of sensing sensitivity.

The first sensor wirings SL1 and the second sensor wirings SL2 may be connected to a pad portion PD disposed in the peripheral area PA. The detection signal may be transmitted to a driving circuit such as, for example, a touch driver through the pad portion PD.

In exemplary embodiments, the first sensor wirings SL1 and the second sensor wirings SL2 may be replaced by, for example, a circuit board, which is manufactured separately.

As described above, the touch sensor TS according to exemplary embodiments may sufficiently extend the outermost sensor patterns MOSP1 and MOSP2 overlapping the non-square area (e.g., the trench or the round boundary area) to the peripheral area PA. As a result, sufficient touch capacitance may be ensured. Therefore, the touch sensitivity in the non-square boundary portion (e.g., the trench or the round boundary area) of the display area DA may be improved.

Figure 4:
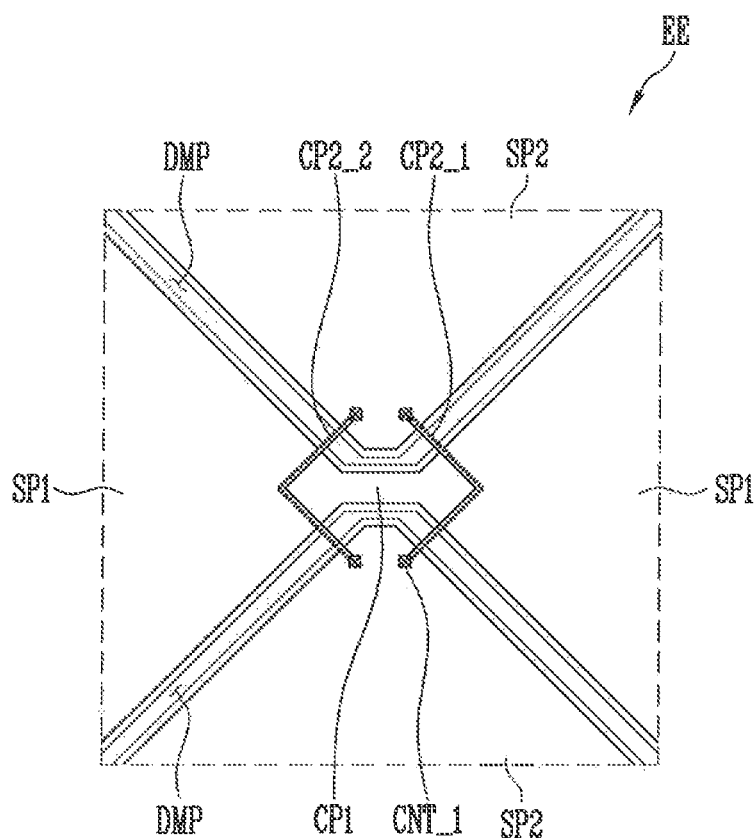
FIG. 4 is a diagram illustrating an example of an intersection area included in the touch sensor of the display device of FIG. 1.

FIG. 4 is a diagram illustrating an example of an intersection area included in the touch sensor of the display device of FIG. 1.

Referring to FIGS. 3A to 4, in exemplary embodiments, the touch sensor TS includes the first sensor pattern SP1, the second sensor pattern SP2, a first connecting portion CP1, and a plurality of second connecting portions CP2_1 and CP2_2 in a single intersection area EE.

The first sensor pattern SP1 and the first connecting portion CP1 may be connected to each other on one plane.

The portions of the second sensor pattern SP2 may be disposed apart from each other. The portions of the second sensor pattern SP2 may be connected to each other by the second connecting portions CP2_1 and CP2_2. The second connecting portions CP2_1 and CP2_2 may connect the adjacent portions of the second sensor pattern SP2 in the form of a bridge via a contact hole CNT_1.

In exemplary embodiments, the first sensor pattern SP1 and the second sensor pattern SP2 may include a transparent conductive material. For example, the first sensor pattern SP1 and the second sensor pattern SP2 may be formed of a transparent conductive oxide material such as indium tin oxide (ITO), indium zinc oxide (IZO), zinc oxide (ZnO), or indium tin zinc oxide (ITZO). In exemplary embodiments, the transparent conductive material may include, for example, metal nanowires, graphene, conductive polymers such as PEDOT, etc. In exemplary embodiments, each of the first sensor pattern SP1 and the second sensor pattern SP2 may be a mesh shape, which may prevent the first sensor pattern SP1 and the second sensor pattern SP2 from being seen by the user.

The touch sensor TS senses the touch by the capacitance change between the first sensor pattern SP1 and the second sensor pattern SP2.

In exemplary embodiments, the touch sensor TS further includes a dummy electrode DMP disposed between the sensor patterns SP1 and SP2. The dummy electrode DMP may be formed by the same process as the first sensor pattern SP1 and the second sensor pattern SP2. Thus, the dummy electrode DMP may include the same material and the same lamination structure as the first and second sensor patterns SP1 and SP2. The dummy electrode DMP is not electrically connected to the first sensor pattern SP1 and the second sensor pattern SP2 as a floating electrode. A boundary between the first sensor pattern SP1 and the second sensor pattern SP2 may not be recognized by disposing the dummy electrode DMP. In addition, the fringe effect between the first sensor pattern SP1 and the second sensor pattern SP2 may be controlled by controlling the width and thickness of the dummy electrode DMP. As a result, the touch capacitance between the first and second sensor patterns SP1 and SP2 may be improved.

In exemplary embodiments, an outermost dummy electrode DMP corresponding to the non-square boundary of the dummy electrodes DMP may be formed over the display area DA and the peripheral area PA.

Figure 5:
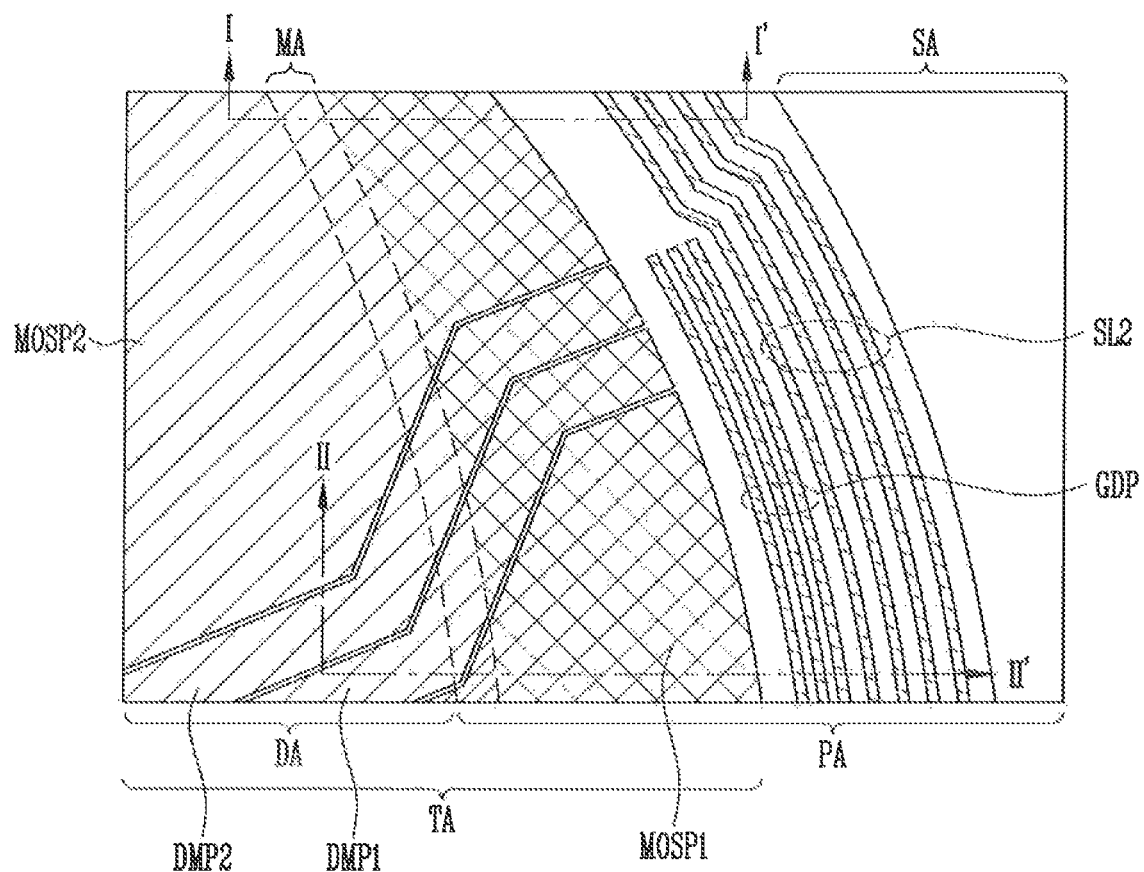
FIG. 5 is an enlarged view illustrating an example of region 'A' region of the display device of FIG. 1.

FIG. 5 is an enlarged view illustrating an example of region 'A' of the display device of FIG. 1.

Referring to FIG. 5, in exemplary embodiments, the first and second outermost sensor patterns MOSP1 and MOSP2, and the outermost dummy electrodes DMP1 and DMP2 that correspond to the non-square boundary of the display area DA, are formed over the display area DA and the peripheral area PA.

The first outermost sensor pattern MOSP1 and the second outermost sensor pattern MOSP2 may be disposed over the display area DA and the adjacent peripheral area PA, respectively. The touch active area TA may be defined by the positions of the first outermost sensor pattern MOSP1 and/or the second outermost sensor pattern MOSP2. As the first outermost sensor pattern MOSP1 and the second outermost sensor pattern MOSP2 extend to the outer portion of the display area DA, areas of the first outermost sensor pattern MOSP1 and the second outermost sensor pattern MOSP2 may be increased with increased capacitance.

In exemplary embodiments, a conductive pattern may be disposed in the peripheral area PA. The conductive pattern may overlap a portion of the first and second outermost sensor patterns MOSP1 and MOSP2. The conductive pattern may be connected to the first and second outermost sensor patterns MOSP1 and MOSP2 through contact holes passing through the insulating layer. The conductive pattern may be disposed on a different layer from the first and second outermost sensor patterns MOSP1 and MOSP2.

The conductive pattern may function as an anti-reflection conductive pattern, and may include, for example, an opaque conductive material. In exemplary embodiments, the conductive pattern may include, for example, molybdenum, silver, titanium, copper, aluminum, and alloys thereof in a single layer structure. In exemplary embodiments, the conductive pattern may have a three-layer structure of titanium/aluminum/titanium in a multilayer structure.

Hereinafter, the conductive pattern will be described as an anti-reflection conductive pattern.

The anti-reflection conductive pattern may improve reflection of external light and deterioration of side visibility by the outermost sensor patterns MOSP1 and MOSP2 which are transparent in the peripheral area PA. That is, the boundary of the display area DA may be clearly defined by the opaque anti-reflection conductive pattern, and the visibility may be improved.

In exemplary embodiments, the peripheral area PA may include a margin area MA that is in contact with the boundary of the display area DA. The anti-reflection conductive pattern may be disposed only on the outside of the margin area MA. When the anti-reflection conductive pattern is in direct contact with the display area DA, the side visibility of the boundary portion of the display area DA may be deteriorated due to the opaque color of the anti-reflection conductive pattern. Therefore, a predetermined margin area MA may be interposed between the display area DA and the opaque anti-reflection conductive pattern to improve the side visibility.

In exemplary embodiments, the anti-reflection conductive pattern may be formed such that it overlaps the first and second outermost sensor patterns MOSP1 and MOSP2 and the outermost dummy electrodes DMP1 and DMP2. However, the anti-reflection conductive pattern is not electrically connected to the outermost dummy electrodes DMP1 and DMP2.

Referring to FIGS. 3A to 5, in exemplary embodiments, a connecting portion (e.g., CP1 in FIG. 4) that electrically connects the first outermost sensor pattern MOSP1 and another first outermost sensor pattern adjacent thereto may be disposed in the peripheral area PA and overlapped on the anti-reflection conductive pattern. In exemplary embodiments, the connecting portion may include, for example, a transparent conductive material.

In exemplary embodiments, the touch sensor TS may further include the first and second outermost dummy electrodes DMP1 and DMP2 disposed between the sensor patterns SP1 and SP2. In exemplary embodiments, the first and second outermost dummy electrodes DMP1 and DMP2 may correspond to the first and second outermost sensor patterns MOSP1 and MOSP2 of the non-square boundary. For example, the first outermost dummy electrode DMP1 may be disposed adjacent to the first outermost sensor pattern MOSP1, and the second outermost dummy electrode DMP2 may be disposed adjacent to the second outermost sensor pattern MOSP2. The first and second outermost dummy electrodes DMP1 and DMP2 may be spaced apart from the first and second outermost sensor patterns MOSP1 and MOSP2, respectively. The first and the second outermost dummy electrodes DMP1 and DMP2 may extend to corresponding regions in which the first and second outermost sensor patterns MOSP1 and MOSP2 extend.

The first outermost dummy electrode DMP1 may control the fringe effect by the first outermost sensor pattern MOSP1, and the second outermost dummy electrode DMP2 may control the fringe effect by the second outermost sensor pattern MOSP2.

The first and second sensor wirings SL1 and SL2 for driving the touch sensing may be disposed outside the touch active area TA. For example, the second sensor wiring SL2 may be disposed along the non-square boundary of the touch active area TA. The first and second sensor wirings SL1 and SL2 may include, for example, a low resistivity opaque conductive material.

In exemplary embodiments, the touch sensor TS may further include at least one shield electrode GDP disposed between the sensor electrodes (e.g., the first and second outermost sensor patterns MOSP1 and MOSP2) and the second sensor wirings SL2. The shield electrode GDP may be spaced apart from the sensor electrodes and the sensor wirings SL2. The shield electrode GDP may include, for example, an opaque conductive material. The shield electrode GDP may be, for example, a floating electrode. Thus, the shield electrode GDP is not electrically connected to the sensor electrodes (e.g., the first and second outermost sensor patterns MOSP1 and MOSP2) and the second sensor wirings SL2.

The shield electrode GDP may block the electrical influence (e.g., a coupling) between the sensor electrodes and the second sensor wirings SL2. Therefore, the touch sensitivity may be improved by the arrangement of the shield electrode GDP.

In exemplary embodiments, a sealing area SA may be located outside the second sensor wirings SL2. The display panel DP and the touch sensor TS may be bonded by a sealant included in the sealing area SA.

As described above, the first and second outermost sensor patterns MOSP1 and MOSP2 overlapping the non-square area (e.g., the trench or the round boundary portion) may extend to the peripheral area PA as much as possible, so that a sufficient capacitance for sensing the touch input may be secured. Therefore, the touch sensitivity in the non-square boundary portion of the display area DA may be improved. In addition, since the opaque anti-reflection conductive pattern is overlapped on the first and second outermost sensor patterns MOSP1 and MOSP2 corresponding to the peripheral area PA, the boundary of the display area DA may be clearly defined, and the external light reflection and the visibility may be improved.

FIGS. 6 to 9 are cross-sectional views taken along line I-I' of region 'A' of FIG. 5 according to exemplary embodiments of the inventive concept.

Referring to FIGS. 6 to 9, in exemplary embodiments, the display device includes the display panel DP and the touch sensor TS. FIGS. 6 to 9 show examples of the non-square boundary portion. For example, the non-square boundary may be a trench (a notch), a rounded boundary, a corner having an obtuse angle, etc. However, it is to be understood that these are examples, and shapes of the non-square boundary are not limited thereto.

Figure 6:
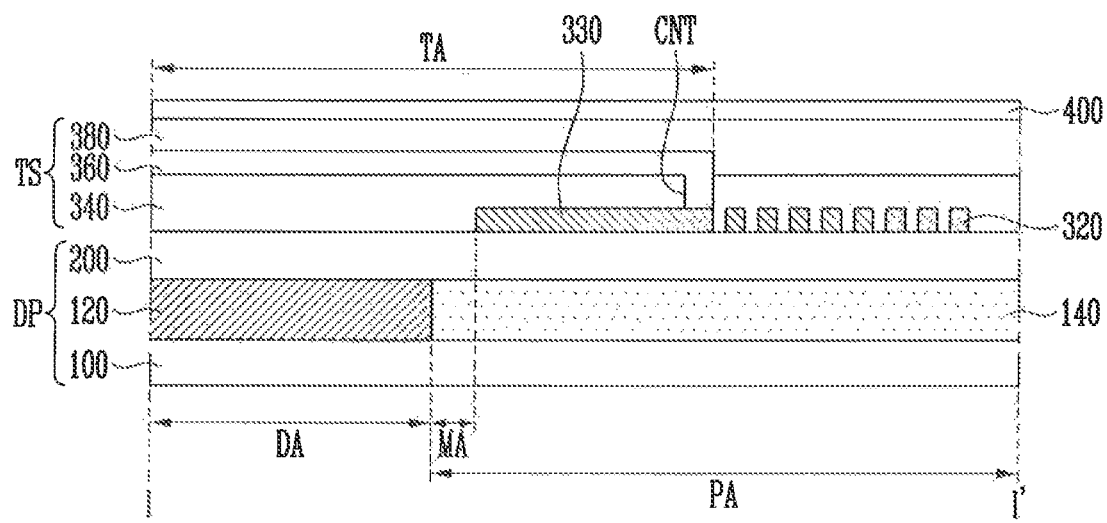
FIGS. 6 to 9 are cross-sectional views taken along line I-I' of region 'A' region of FIG. 5 according to exemplary embodiments of the inventive concept.

As illustrated in FIG. 6, in exemplary embodiments, the display panel DP may include a base layer 100 and an encapsulation layer 200. The circuit element layer DP-CL and the display element layer DP-OLED may be disposed between the base layer 100 and the encapsulation layer 200. In the figures, the circuit element layer DP-CL and the display element layer DP-OLED are illustrated together as layer 120. The display panel DP may be divided into a display area DA and a peripheral area PA disposed outside of or surrounding the display area DA.

The base layer 100 may include, for example, a synthetic resin film. In exemplary embodiments, the base layer 100 may include, for example, an organic substrate, a metal substrate, an organic/inorganic composite substrate, etc.

The circuit element layer DP-CL and the display element layer DP-OLED (e.g., layer 120) described in FIG. 2 may be disposed in the display area DA, in which images are displayed. A data line, a scan line, a power supply line, etc. for driving the display area DA, as well as various driving circuits, may be disposed in the peripheral area PA. In the figures, the driving circuits and/or a plurality of signal lines (e.g., the data line, the scan line, and the power supply line) in the peripheral area PA are illustrated together as layer 140.

The encapsulation layer 200 may have a form in which an organic layer and an inorganic layer are alternately and repeatedly deposited. In exemplary embodiments, the encapsulation layer 200 may be an encapsulating substrate in the form of an organic substrate.

The touch sensor TS may be disposed on the encapsulation layer 200. The touch sensor TS may be disposed directly on the encapsulation layer 200 or may be bonded with the adhesive member therebetween. The touch active area TA of the touch sensor TS may overlap the display area DA and a part of the peripheral area PA adjacent thereto.

The touch sensor TS may include, for example, a first conductive layer 320 and 330, a first insulating layer 340, a second conductive layer 360, and a second insulating layer 380.

The first conductive layer 320 and 330 and the second conductive layer 360 may have a single-layer structure or a multi-layer structure.

The first conductive layer 320 and 330 and the second conductive layer 360 may include a plurality of patterns.

In exemplary embodiments, the first conductive layer 320, 330 may include a sensor wiring pattern 320 and an anti-reflection conductive pattern 330. The second conductive layer 360 may include a dummy electrode pattern including a dummy electrode (e.g., DMP1 and DMP2 in FIG. 5), and a sensor electrode pattern including an outermost sensor pattern (e.g., MOSP1 and MOSP2 in FIG. 5).

In exemplary embodiments, the anti-reflection conductive pattern 330 may be disposed in the peripheral area PA that overlaps the touch active area TA. The anti-reflection conductive pattern 330 may include, for example, the opaque conductive material. For example, the anti-reflection conductive pattern 330 may include molybdenum, silver, titanium, copper, aluminum, and alloys thereof.

The anti-reflection conductive pattern 330 may suppress the reflection of external light in the transparent sensor pattern (e.g., the second conductive layer 360) overlapped thereon. In addition, the anti-reflection conductive pattern 330 may be formed on the peripheral area PA overlapping the touch active area TA.

In exemplary embodiments, the anti-reflection conductive pattern 330 (the opaque conductive layer) may be disposed in the peripheral area PA overlying the second conductive layer 360 (the transparent conductive layer). For example, the anti-reflection conductive pattern 330 may be disposed only in a region of the peripheral area PA that overlaps the second conductive layer 360. For example, the anti-reflection conductive pattern 330 may be disposed in the peripheral area PA overlapping portions at which the outermost sensor pattern (MOSP1 and MOSP2 in FIG. 5) overlaps the peripheral area PA and a portion at which the outermost dummy electrode (DMP1 and DMP2 in FIG. 5) overlaps the peripheral area PA.

The anti-reflection conductive pattern 330 may be disposed only outside the margin area MA. Therefore, the opaque anti-reflection conductive pattern 330 may clearly define the boundary of the display area DA. As a result, the side visibility may be improved. For example, the anti-reflection conductive pattern 330 may be viewed with a black boundary.

The sensor wiring pattern 320 may be disposed outside the anti-reflection conductive pattern 330. For example, the sensor wiring pattern 320 may be sensor wirings such as the second sensor wirings SL2. The anti-reflection conductive pattern 330 and the sensor wiring pattern 320 may be formed on the same layer by the same process, and may have the same material.

The first insulating layer 340 covering the first conductive layer 320 and 330 may be disposed on the encapsulation layer 200, and the second conductive layer 360 and the second insulating layer 380 may be formed on the first insulating layer 340. The second insulating layer 380 covering the second conductive layer 360 may be disposed on the first insulating layer 340. The first insulating layer 340 and the second insulating layer 380 may include, for example, an inorganic material and/or an organic material.

In exemplary embodiments, at least one of the first insulating layer 340 and the second insulating layer 380 may include an organic layer. The organic layer may include, for example, at least one of an acrylic resin, a methacrylic resin, a polyisoprene, a vinyl resin, an epoxy resin, a urethane resin, a cellulose resin, a siloxane resin, a polyimide resin, and a polyamide resin.

In exemplary embodiments, at least one of the first insulating layer 340 and the second insulating layer 380 may include an inorganic layer. The inorganic layer may include, for example, at least one of aluminum oxide, titanium oxide, silicon oxide silicon oxynitride, zirconium oxide, and hafnium oxide.

The second conductive layer 360 may form the sensor electrode and the dummy electrode. The second conductive layer 360 may include a transparent conductive material. For example, the second conductive layer 360 may include a transparent conductive oxide such as ITO, IZO, ZnO, or ITZO. In addition, the transparent conductive material may include conductive polymers such as, for example, PEDOT, metal nanowires, graphene, etc. Thus, the first conductive layers 320 and 330 may be opaque conductive layers, and the second conductive layer 360 may be a transparent conductive layer. The second conductive layer 360 may be connected to the pattern of the first conductive layer 320 and 330 through a contact hole passing through the first insulating layer 340.

The second conductive layer 360 in FIG. 6 may be the second outermost sensor pattern MOSP2. That is, the second outermost sensor pattern MOSP2 may overlap a portion of the display area DA and a portion of the peripheral area PA adjacent to the non-square boundary of the display area DA. Therefore, a sufficient area of the second outermost sensor pattern MOSP2 may be ensured, and the touch sensitivity may be increased.

The anti-reflection layer 400 may be disposed on the touch sensor TS. The anti-reflection layer 400 may suppress the reflection of external light in the display area DA and improve visibility. In exemplary embodiments, the anti-reflection layer 400 may include a phase retarder and/or a polarizer. The phase retarder may be, for example, a film type or a liquid crystal coating type, and may include, for example, a λ/2 phase retarder and/or a λ/4 phase retarder. The polarizer may also be of a film type or liquid crystal coating type. The film type may include, for example, a stretch-type synthetic resin film, and the liquid crystal coating type may include, for example, liquid crystals arranged in a predetermined arrangement.

In addition, a functional layer such as, for example, an anti-fingerprint layer, a hard coat layer, and a protective film, may be further disposed on or below the anti-reflection layer 400.

Figure 7:
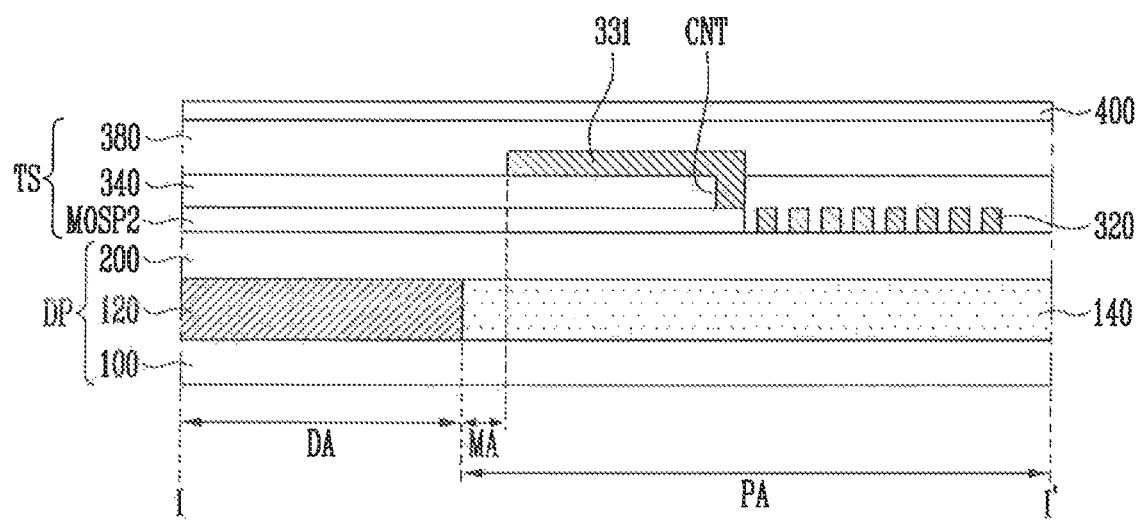
Figure 8:
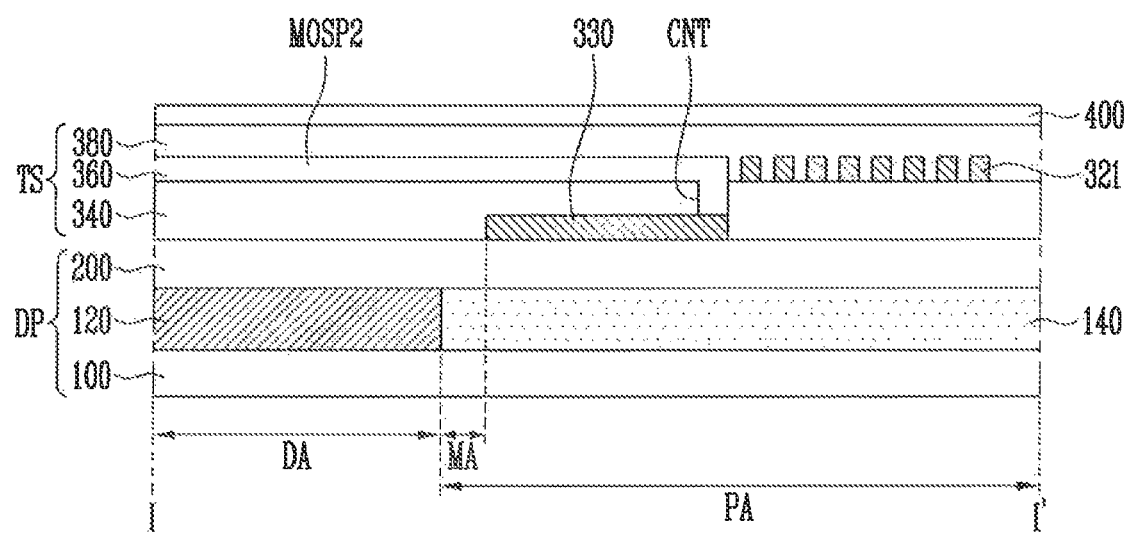
Figure 9:
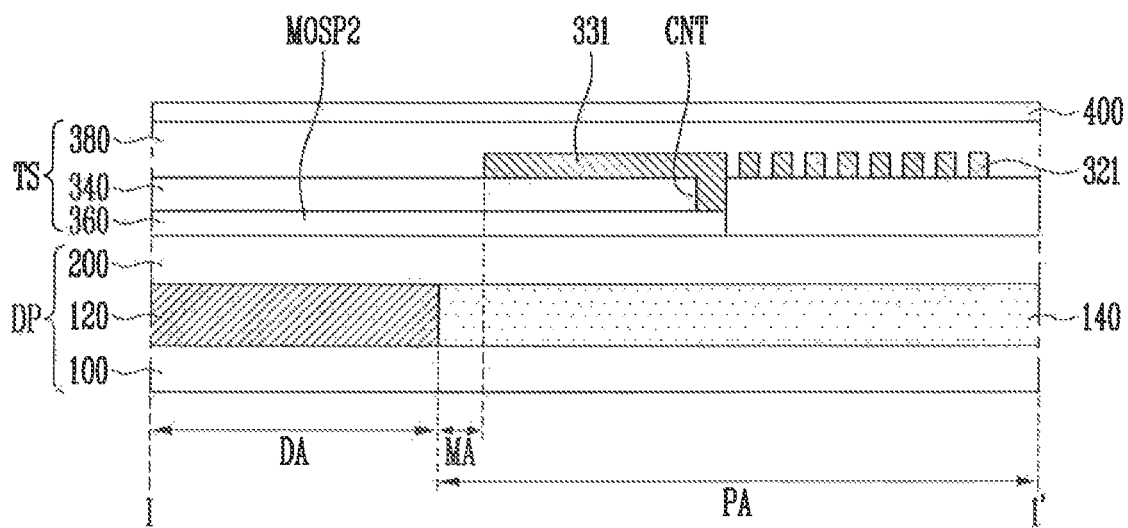

FIGS. 7 to 9 are substantially the same as the display device structure of FIG. 6, except for the arrangement positions of the first and second conductive layers. Therefore, for convenience of explanation, a further description of elements previously described may be omitted.

As illustrated in FIG. 7, in exemplary embodiments, the sensor electrodes including the second outermost sensor pattern MOSP2 may be disposed on the same layer as the sensor wiring patterns 320. An anti-reflection conductive pattern 331 may be disposed on the second outermost sensor pattern MOSP2 and may be connected to the second outermost sensor pattern MOSP2 through the contact hole CNT. That is, the anti-reflection conductive pattern 331 may be formed on a different layer from the sensor wiring patterns 320. The arrangement relationship of these conductive patterns can bring about a reduction in width (bezel reduction) of the peripheral area PA.

In exemplary embodiments, the contact holes CNT of FIGS. 6 to 9 may be formed anywhere in the region overlapping the outermost sensor outside the margin area MA.

As illustrated in FIG. 8, in exemplary embodiments, sensor wiring patterns 321 may be disposed above the anti-reflection conductive pattern 330. In FIG. 8, all of the sensor wiring patterns 321 are disposed above the anti-reflection conductive pattern 330. However, exemplary embodiments are not limited thereto. For example, in exemplary embodiments, some of the sensor wiring patterns 321 may be disposed on the same layer as the anti-reflection conductive pattern 330.

As illustrated in FIG. 9, in exemplary embodiments, the anti-reflection conductive pattern 331 and the sensor wiring patterns 321 may be disposed on the second outermost sensor pattern MOSP2. Since the anti-reflection conductive pattern 331 and the sensor wiring patterns 321 may be formed by the same process, the manufacturing cost can be reduced.

As described above, the first and second outermost sensor patterns MOSP1 and MOSP2 of the display device according to exemplary embodiments may maximally extend to the peripheral area PA. As a result, the touch sensitivity in the non-square boundary may be improved. In addition, the opaque anti-reflection conductive patterns 330 and 331 may overlap the first and second outermost sensor patterns MOSP1 and MOSP2 corresponding to the peripheral area PA. Thus, the visibility may be improved.

Figure 10:
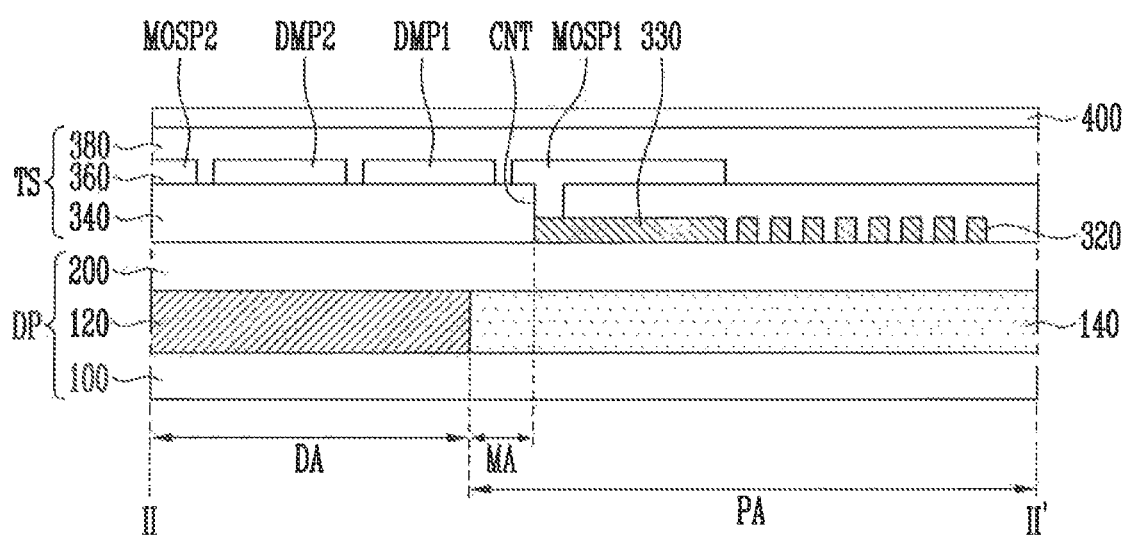
FIG. 10 is a cross-sectional view taken along line II-II' of region 'A' of FIG. 5 according to exemplary embodiments of the inventive concept.

FIG. 10 is a cross-sectional view taken along line II-II' of region 'A' of FIG. 5 according to exemplary embodiments of the inventive concept.

Since the display device of FIG. 10 is substantially the same as the display device of FIGS. 5 and 6, for convenience of explanation, a further description of elements previously described may be omitted.

Referring to FIGS. 5 and 10, in exemplary embodiments, the touch sensor TS includes the first conductive layer 320 and 330, the first insulating layer 340, the second conductive layer 360, and the second insulating layer 380. The first conductive layer 320 and 330, and the second conductive layer 360, may have a single-layer structure or a multi-layer structure.

The first conductive layer 320 and 330 may include an anti-reflection conductive pattern 330 and a shield electrode pattern (e.g., the shield electrode GDP). That is, the anti-reflection conductive pattern 330, the sensor wiring pattern, and the shield electrode pattern may be formed in the same process.

The second conductive layer 360 may include the first outermost sensor pattern MOSP1, the second outermost sensor pattern MOSP2, the first dummy electrode DMP1, and the second dummy electrode DMP2. In exemplary embodiments, the first dummy electrode DMP1 and the second dummy electrode DMP2 are not connected to the anti-reflection conductive pattern 330. However, in exemplary embodiments, at least one of the first dummy electrode DMP1 and the second dummy electrode DMP2 may be connected to the anti-reflection conductive pattern 330 through a contact hole. Then, the conductive pattern connected to the first dummy electrode DMP1 or the second dummy electrode DMP2 is not connected to the outermost sensor patterns MOSP1 and MOSP2.

In FIG. 10, the first outermost sensor pattern MOSP1 (and the second outermost sensor pattern MOSP2) may be connected to the lower anti-reflection conductive pattern 330 through the contact hole CNT.

Figure 11:
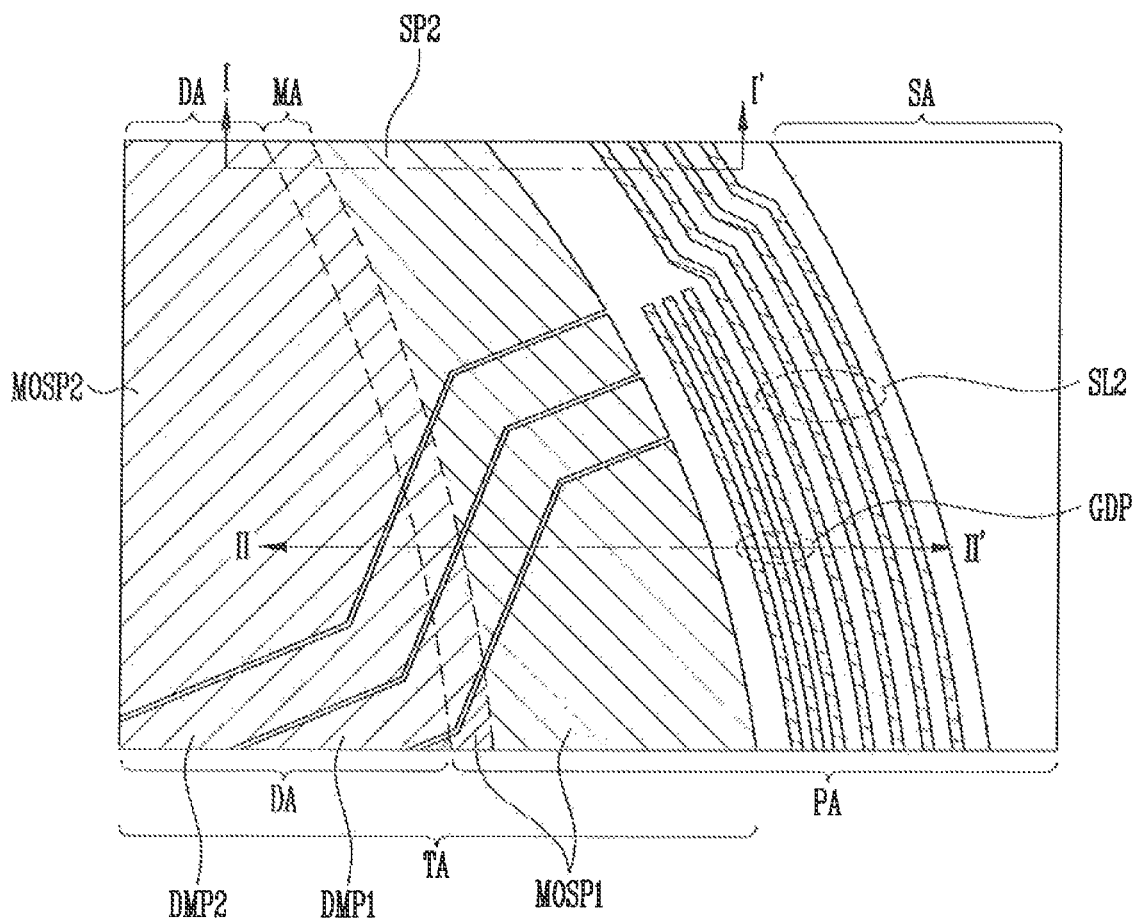
FIG. 11 is an enlarged view illustrating another example of region 'A' region of the display device of FIG. 1.
Figure 12:
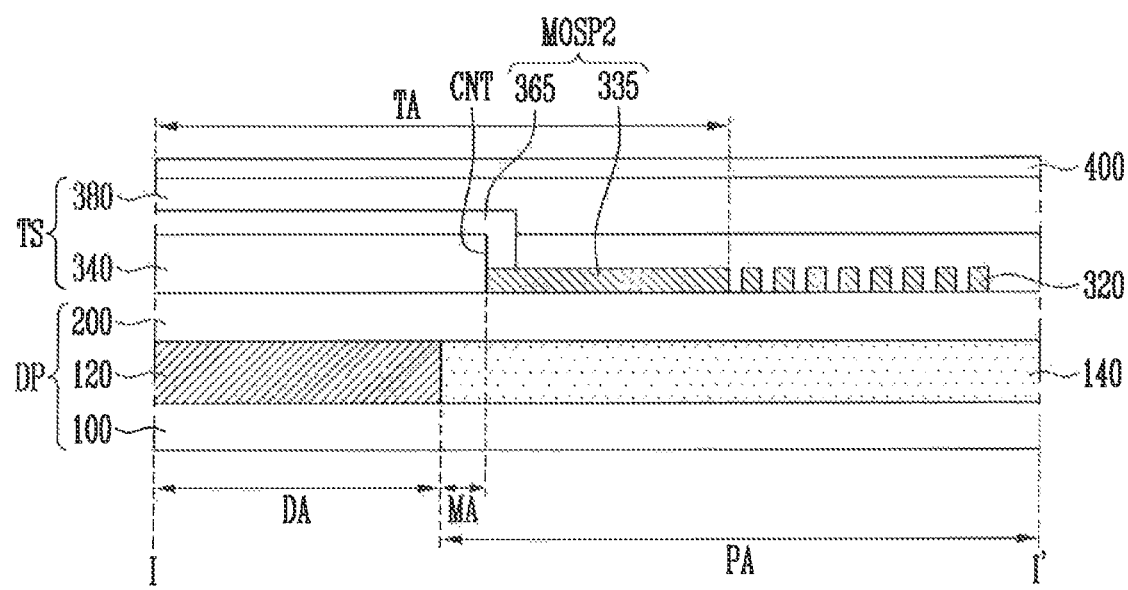
FIGS. 12 and 13 are cross-sectional views taken along line I-I' of region 'A' of FIG. 11 according to exemplary embodiments of the inventive concept.
Figure 13:
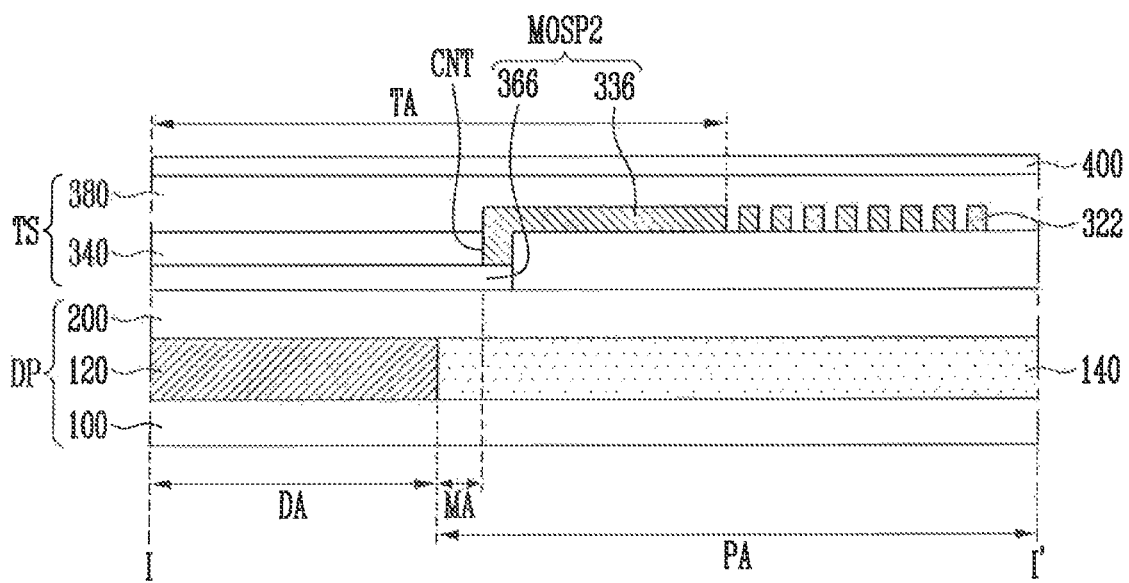
Figure 14:
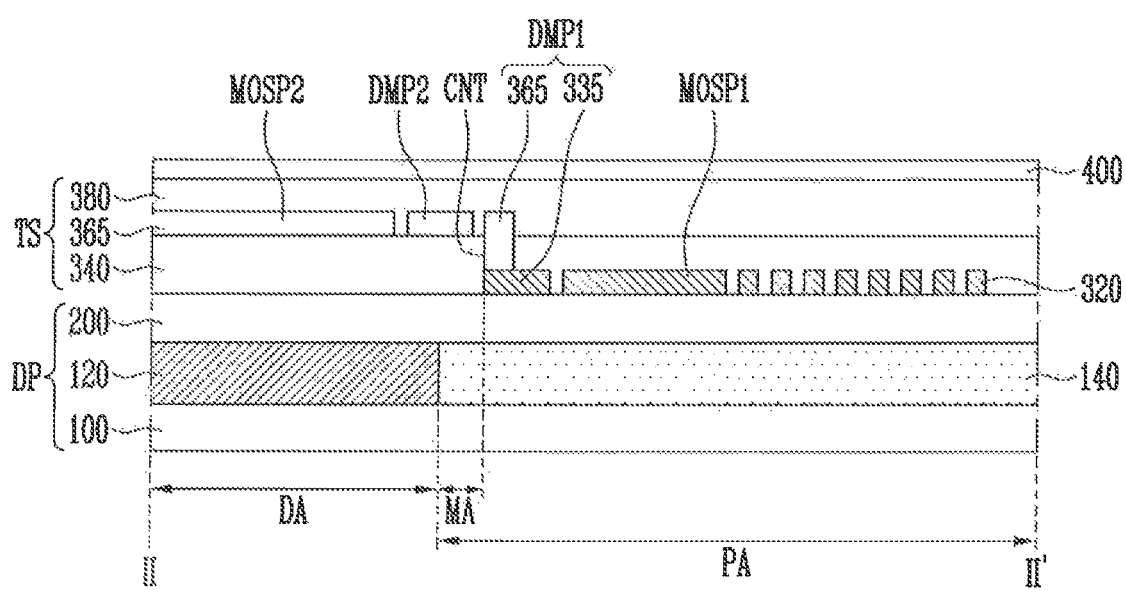
FIG. 14 is a cross-sectional view taken along line II-II' of region 'A' of FIG. 11 according to exemplary embodiments of the inventive concept.

FIG. 11 is an enlarged view illustrating another example of region 'A' of the display device of FIG. 1. FIGS. 12 and 13 are cross-sectional views taken along line I-I' of region 'A' of FIG. 11 according to exemplary embodiments of the inventive concept. FIG. 14 is a cross-sectional view taken along line II-II' of region 'A' of FIG. 11 according to exemplary embodiments of the inventive concept.

Since the touch sensor according to exemplary embodiments is substantially the same as the sensor electrode and the display device having the same of FIGS. 5 and 6 except for the arrangement of the sensor electrode (outermost sensor pattern), for convenience of explanation, a further description of elements previously described may be omitted.

Referring to FIGS. 11 to 14, in exemplary embodiments the first and second outermost sensor patterns MOSP1 and MOSP2 and the outermost dummy electrodes DMP1 and DMP2 corresponding to the non-square boundary of the display area DA may be formed over a part of the peripheral area PA and the display area DA.

The peripheral area PA may include the margin area MA in contact with the boundary of the display area DA. The opaque conductive layer (conductive pattern) is not disposed in the margin area MA. Thus, side visibility with respect to the boundary of the display area DA may be improved. For example, as shown in FIG. 12, a second conductive layer pattern 335, which is the opaque conductive layer, may be extended in a direction from an outermost portion of the first conductive layer pattern 365 to a portion not overlapping the first conductive layer pattern 365.

Each of the first and second outermost sensor patterns MOSP1 and MOSP2 may include a first conductive layer pattern 365 and 366 corresponding to the display area DA and the margin area MA, and a second conductive layer pattern 335 and 336 connected to the first conductive layer pattern 365 and 366 through a contact hole CNT passing through the insulating layer. The second conductive layer pattern 335 and 336 may correspond to the peripheral area PA outside the margin area MA. That is, the first and second outermost sensor patterns MOSP1 and MOSP2 may be composed of a plurality of conductive layers connected through a contact hole CNT, as illustrated in FIGS. 12 and 13.

In exemplary embodiments, the first conductive layer pattern 365 and 366 corresponding to the display area DA and the margin area MA may include the transparent conductive material, and the second conductive layer pattern 335 and 336 corresponding to the peripheral area PA may include the opaque conductive material.

In exemplary embodiments, as illustrated in FIG. 12, the second conductive layer pattern 335 may be disposed between the first conductive layer pattern 365 and the display panel DP. In exemplary embodiments, as illustrated in FIG. 13, the second conductive layer pattern 336 may be disposed on a layer above the first conductive layer pattern 366.

As illustrated in FIG. 14, the portions of the second outermost sensor pattern MOSP2 located in the display area DA and the margin area MA may be disposed on the first insulating layer 340. The portions of the first and second outermost dummy electrodes DMP1 and DMP2 located in the peripheral area PA outside the margin area MA may be arranged to be covered by the first insulating layer 340.

Here, since the first outermost dummy electrode DMP1 is a floating electrode, the dummy electrodes DMP1 and DMP2 may be formed of the second conductive layer pattern 335 in the peripheral area PA outside the margin region MA.

The touch sensor TS of FIGS. 11 to 14 is different from the exemplary embodiment of FIG. 5 in that the transparent conductive layer pattern (e.g., the outermost sensor pattern) does not extend to the peripheral area PA. As a result, the touch sensor TS of FIGS. 11 to 14 may prevent an unintentional change of an optical path such as a shift of the external light by the transparent conductive layer pattern disposed in the peripheral area PA. Therefore, the touch sensor TS of FIGS. 11 to 14 may improve the visibility by removing the transparent conductive layer pattern in the peripheral area PA.

The sensor wiring patterns 320 and 322 may be formed on the same layer in the same process as the second conductive layer pattern 336 including the opaque conductive material.

Figure 15:
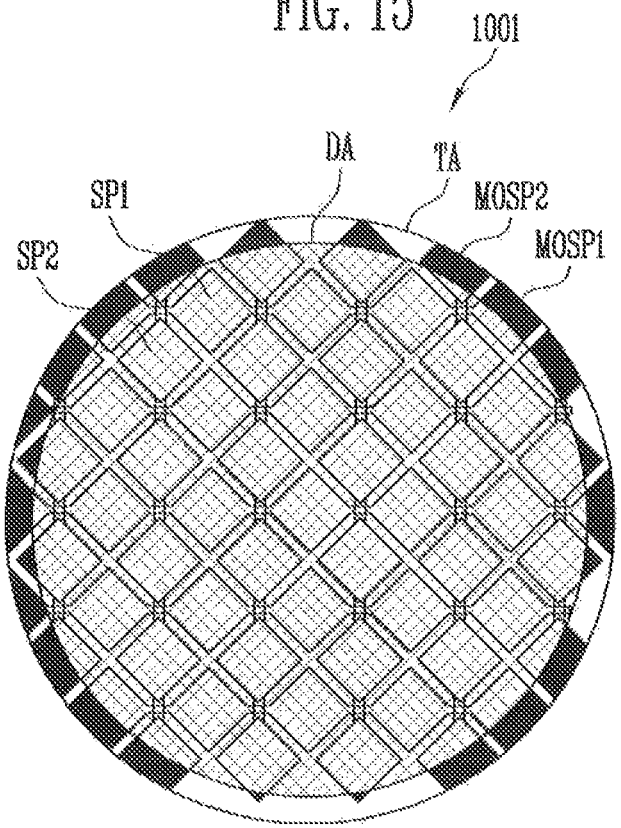
FIGS. 15 and 16 are diagrams illustrating examples of a display area and a touch active area included in a display device according to exemplary embodiments of the inventive concept.
Figure 16:
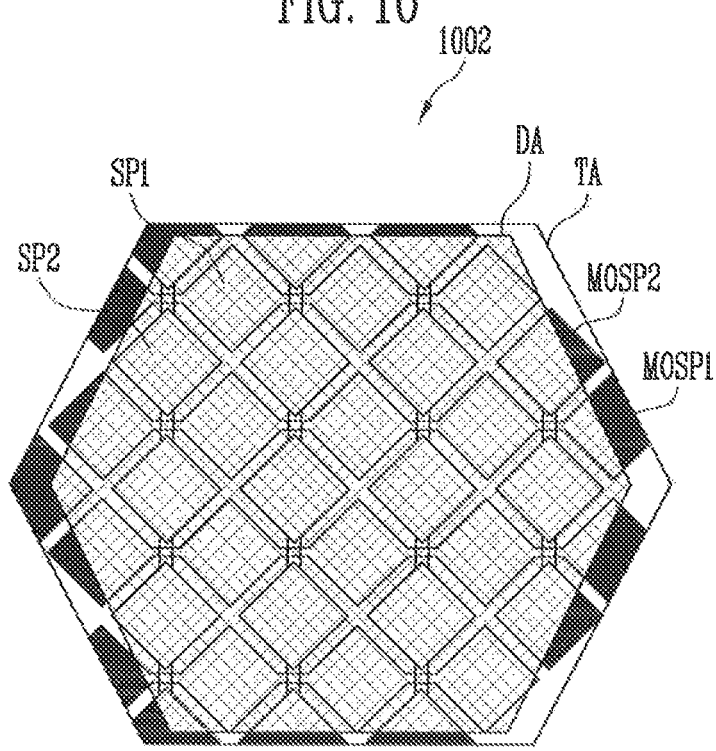

FIGS. 15 and 16 are diagrams illustrating examples of a display area and a touch active area included in a display device according to exemplary embodiments of the inventive concept.

Referring to FIGS. 15 and 16, the display area DA and the touch active area TA of a display device 1001 and 1002 may include non-square boundaries.

In exemplary embodiments, as illustrated in FIG. 15, the display area DA may be circular or elliptical. In exemplary embodiments, as illustrated in FIG. 16, the display area DA may be a polygon having a larger number of sides than a square. For example, the display device 1001 and 1002 may be applied to a watch, a wearable display device, etc.

The touch active area TA may overlap the entire display area DA and a portion of the peripheral area adjacent to the non-square boundary of the display area DA. In exemplary embodiments, the first and second outermost sensor patterns MOSP1 and MOSP2 corresponding to the non-square boundaries may be formed over the display area DA and the peripheral area. Therefore, the area of the outermost sensor patterns MOSP1 and MOSP2 may be increased and the touch sensitivity can be improved.

On the other hand, the opaque conductive layer which overlaps the first and second outermost sensor patterns MOSP1 and MOSP2 may be disposed at a portion at which the first and second outermost sensor patterns MOSP1 and MOSP2 overlap the peripheral area surrounding the display area DA. The opaque conductive layer may suppress external light reflection of the transparent first and second outermost sensor patterns MOSP1 and MOSP2 in the peripheral area, and may clarify the boundaries of the display area DA. FIGS. 15 and 16 illustrate that the opaque conductive layer is irregularly formed. However, the planar shapes of the first and second outermost sensor patterns MOSP1 and MOSP2 and the opaque conductive layer that overlap the peripheral area on the insulating layer may have the same shape and/or the same area.

As described above, the touch sensor may include the non-square touch active area TA corresponding to the display area DA having the non-square boundary. Further, the areas of the outermost sensor patterns may be maximized by being formed over the peripheral area PA and the display area DA corresponding to the non-square boundary. Thus, the sensitivity of the touch sensing in the non-square boundary of the display area DA may be improved.

In addition, the opaque conductive pattern may overlap the outermost sensor pattern corresponding to the peripheral area, or the outermost sensor pattern corresponding to the peripheral area may be formed of the opaque conductive pattern. As a result, the boundaries of the display area DA can be clarified and the reflection of external light at the boundaries of the display area DA may be prevented. Thus, the visibility at the boundaries of the display area DA and the side visibility may be improved.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A display device, comprising:
a display panel comprising a display area in which an image is displayed, and a peripheral area disposed outside of the display area; and
a touch sensor disposed on the display panel,
wherein the touch sensor comprises:
a plurality of sensor electrodes formed in a repeated arrangement of sensor patterns and configured to detect an external input, wherein the repeated arrangement of sensor patterns forms a touch active area having a non-square boundary;
a plurality of sensor wirings connected to the sensor electrodes and disposed outside of the touch active area; and
at least one insulating layer overlapping the display area and the peripheral area and covering at least one of the sensor electrodes,
wherein at least a portion of the sensor electrodes overlaps both the display area and the peripheral area,
wherein an outermost sensor pattern corresponding to the non-square boundary of the sensor electrodes comprises a transparent conductive layer and an opaque conductive layer connected to the transparent conductive layer through a first contact hole passing through the at least one insulating layer, and the outermost sensor pattern is configured to detect the external input,
wherein the transparent conductive layer of the outermost sensor pattern overlaps both the display area and the peripheral area adjacent to the display area,
the opaque conductive layer is disposed in the peripheral area, and
the opaque conductive layer overlaps the transparent conductive layer in the peripheral area.

2. The display device of claim 1, wherein each of the display area and the touch active area comprises the non-square boundary.

3. The display device of claim 2, wherein the sensor electrodes overlap an entirety of the display area and a portion of the peripheral area adjacent to the non-square boundary of the display area.

4. The display device of claim 2, wherein each of the sensor electrodes comprises a first sensor pattern and a second sensor pattern intersecting with each other.

5. The display device of claim 4, wherein the touch sensor further comprises:
a conductive pattern disposed in the peripheral area and overlapping a portion of the outermost sensor pattern,
wherein the conductive pattern is connected to the outermost sensor pattern through a second contact hole passing through the at least one insulating layer.

6. The display device of claim 5, wherein the conductive pattern is disposed between the outermost sensor pattern and the display panel.

7. The display device of claim 5, wherein the conductive pattern is disposed on the outermost sensor pattern.

8. The display device of claim 5, wherein the conductive pattern comprises an opaque conductive material, and the sensor electrodes comprise a transparent conductive material.

9. The display device of claim 5, wherein the sensor wirings and the conductive pattern are disposed on a same insulating layer of the at least one insulating layer.

10. The display device of claim 5, wherein the sensor wirings and the sensor electrodes are disposed on a same insulating layer of the at least one insulating layer.

11. The display device of claim 4, wherein the peripheral area comprises a margin area in contact with a boundary of the display area.

12. The display device of claim 2, wherein the touch sensor further comprises:
a plurality of dummy electrodes disposed between the sensor patterns.

13. The display device of claim 12, wherein an outermost dummy electrode corresponding to the non-square boundary of the dummy electrodes is formed over the display area and the peripheral area.

14. The display device of claim 2, wherein the touch sensor further comprises:
at least one shield electrode disposed between the sensor electrodes and the sensor wirings in the peripheral area, wherein the at least one shield electrode shields an electrical influence between the sensor electrodes and the sensor wirings.

15. A display device, comprising:
a display panel comprising a display area comprising a non-square boundary, and a peripheral area disposed outside of the display area; and
a touch sensor disposed on the display panel,
wherein the touch sensor comprises:
a plurality of sensor electrodes formed in a repeated arrangement of sensor patterns and configured to detect an external input, wherein the repeated arrangement of sensor patterns forms a touch active area;
a plurality of dummy electrodes disposed between the sensor patterns; and
a plurality of sensor wirings connected to the sensor electrodes and disposed outside of the touch active area,
wherein an outermost sensor pattern has a non-square shape at the non-square boundary of the sensor electrodes,
wherein the outermost sensor pattern, and an outermost dummy electrode corresponding to the outermost sensor pattern of the dummy electrodes, overlap both a portion of the display area and a portion of the peripheral area,
wherein the outermost sensor pattern comprises a transparent conductive layer and an opaque conductive layer connected to the transparent conductive layer through a contact hole passing through at least one insulating layer, and the outermost sensor pattern is configured to detect the external input,
wherein the transparent conductive layer of the outermost sensor pattern overlaps both the display area in which an image is displayed and the peripheral area adjacent to the display area,
the opaque conductive layer is disposed in the peripheral area, and
the opaque conductive layer overlaps the transparent conductive layer in the peripheral area.

16. The display device of claim 15, further comprising:
an anti-reflection layer disposed on the touch sensor.

17. The display device of claim 16, wherein the peripheral area comprises a margin area in contact with a boundary of the display area.

18. The display device of claim 15, wherein the touch sensor further comprises:
an anti-reflection conductive pattern disposed on the peripheral area and overlapping a portion of the outermost sensor pattern overlapping the peripheral area and a portion of the outermost dummy electrode overlapping the peripheral area.

19. A touch sensor, comprising:
- a plurality of sensor electrodes formed in a repeated arrangement of sensor patterns, wherein the repeated arrangement of sensor patterns forms a touch active area having a non-square boundary;
- a plurality of sensor wirings connected to the sensor electrodes and disposed outside of the touch active area; and
- at least one insulating layer overlapping the touch active area and a peripheral area disposed outside of the touch active area,
- wherein an outermost sensor pattern corresponding to the non-square boundary of the sensor electrodes comprises a transparent conductive layer and an opaque conductive layer connected to the transparent conductive layer through a contact hole passing through the at least one insulating layer, and the outermost sensor pattern is configured to detect an external input,
- wherein the transparent conductive layer of the outermost sensor pattern overlaps both a display area in which an image is displayed and the peripheral area adjacent to the display area,
- the opaque conductive layer is disposed in the peripheral area, and
- the opaque conductive layer overlaps the transparent conductive layer in the peripheral area.

20. The touch sensor of claim 19, wherein the contact hole is formed at an outermost portion of the transparent conductive layer, and
- the opaque conductive layer extends in a direction that does not overlap the transparent conductive layer from the outermost portion of the transparent conductive layer.

* * * * *